(12) United States Patent
Woo et al.

(10) Patent No.: US 9,166,047 B2
(45) Date of Patent: Oct. 20, 2015

(54) SWITCH CIRCUIT USING LDMOS DEVICE

(71) Applicant: SILICON WORKS CO., LTD, Daejeon-si (KR)

(72) Inventors: Young Jin Woo, Daejeon-si (KR); Kong Soon Park, Daejeon-si (KR); Young Sik Kim, Daejeon-si (KR)

(73) Assignee: SILICON WORKS CO., LTD, Daejeon-Si (KR)

( * ) Notice: Subject to any disclaimer, the term of this patent is extended or adjusted under 35 U.S.C. 154(b) by 0 days.

(21) Appl. No.: 14/294,395

(22) Filed: Jun. 3, 2014

(65) Prior Publication Data
US 2014/0264578 A1   Sep. 18, 2014

Related U.S. Application Data

(63) Continuation-in-part of application No. 13/425,357, filed on Mar. 20, 2012, now Pat. No. 8,836,027.

(30) Foreign Application Priority Data

Mar. 24, 2011   (KR) .................. 10-2011-0026508

(51) Int. Cl.
| | |
|---|---|
| *H01L 29/78* | (2006.01) |
| *H03K 17/10* | (2006.01) |
| *H03K 17/687* | (2006.01) |
| *H01L 27/088* | (2006.01) |
| *H01L 29/10* | (2006.01) |

(52) U.S. Cl.
CPC .......... *H01L 29/7835* (2013.01); *H03K 17/102* (2013.01); *H03K 17/6874* (2013.01); *H01L 27/088* (2013.01); *H01L 29/1083* (2013.01)

(58) Field of Classification Search
USPC ........................................................ 257/338
See application file for complete search history.

(56) References Cited

U.S. PATENT DOCUMENTS

| | | | |
|---|---|---|---|
| 2007/0076452 A1* | 4/2007 | Schultz | ............................ 363/72 |
| 2011/0049621 A1* | 3/2011 | Lotfi et al. | ..................... 257/337 |

* cited by examiner

*Primary Examiner* — David Vu
*Assistant Examiner* — Jonathan Han
(74) *Attorney, Agent, or Firm* — Kile Park Reed & Houtteman PLLC

(57) ABSTRACT

The present invention relates to a switch circuit, and more particularly, to a switch circuit that uses an LDMOS (lateral diffusion metal oxide semiconductor) device inside an IC (Integrated Circuit). In the switch circuit that uses the LDMOS device according to an embodiment of the present invention, a gate-source voltage ($V_{GS}$) of the LDMOS device may be stably controlled through a current source and resistances, the characteristics of a switch may be maintained regardless of the voltages of both terminals (A and B) by using an N-type LDMOS and a P-type LDMOS in a complementary manner, and the current generated by the current source is offset inside the switch without flowing to the outside of the switch.

20 Claims, 3 Drawing Sheets

SWITCH CIRCUIT USING LDMOS DEVICE

CROSS REFERENCE TO RELATED APPLICATIONS

This application is a continuation-in-part application of U.S. patent application Ser. No. 13/425,357, filed Mar. 20, 2012 (now pending), the disclosure of which is herein incorporated by reference in its entirety. The U.S. patent application Ser. No. 13/425,357 claims priority to Korean Application No. 10-2011-0026508 filed on Mar. 24, 2011, the entire contents of which are incorporated herein by reference.

FIELD OF THE INVENTION

The present invention relates to a switch circuit, and more particularly, to a switch circuit that uses an LDMOS device inside an integrated circuit (IC).

DESCRIPTION OF THE RELATED ART

In recent years, as technologies for the integration of semiconductor devices have improved and technologies for designing such semiconductor devices have developed accordingly, attempts to configure a system in a single semiconductor chip have been made. Such technologies for one-chip systems have been developed as technologies for integrating, in a single chip, a controller, memory, and other circuits operated at a low voltage, which perform the main functions of the system.

However, in order to make the system light and small, it is necessary to integrate an input/output terminal, which adjusts the power supply of the system, and a circuit, which performs main functions, in a single chip. Technologies for realizing this include a power IC (Integrated Circuit) technology for integrating a high-voltage device, a low-voltage CMOS (complementary metal oxide semiconductor) device and so on into a single chip.

In order to simultaneously realize a high breakdown voltage and achieve integration with processes for manufacturing low-voltage CMOS devices in the related art, the power IC technology implements a lateral diffusion MOS (hereinafter, referred to as "LDMOS"), in which a drain is disposed horizontally and a drift region is placed between a channel and the drain.

FIG. 1 is a cross-sectional diagram of an LDMOS device.

As shown in FIG. 1, in a general LDMOS device, a high-concentration N-type (N$^+$) buried layer 12 is formed deeply in a P-type substrate 10, and a low-concentration P-type epitaxial layer 14 having a predetermined thickness is formed on the high concentration N-type buried layer 12.

An N well 18 is formed in a predetermined portion inside the low-concentration P-type epitaxial layer 14. In a predetermined portion of the N well 18, a gate 24, which includes gate insulating films 20 and 22, is formed. The gate insulating films 20 and 22 include a thick gate oxide film 20 and a thin gate oxide film 22. A P-type body region 26 is formed in the P-type epitaxial layer 14, which is positioned to one side of the gate 24, and a source region 28a and a high-concentration P-type contact region 30 are formed in the P-type body region 26. Meanwhile, a drain region 28b is formed in the N well 18, which is positioned to the other side of the gate 24. The gate 24 is connected to a gate electrode, the source region 28a and the high-concentration P-type contact region 30 are connected to a source electrode, and the drain region 28b is connected to a drain electrode.

In this manner, in the general LDMOS, a depletion region starts to expand bi-directionally at a P-N junction between the N well 18 and the P-type epitaxial layer 14 when a reverse bias is applied through the drain electrode, and a breakdown state is reached when the expansion of the depletion region reaches some limit. Accordingly, a high breakdown voltage may be secured in proportion to the thickness of the P-type epitaxial layer 14.

As described above, the LDMOS device, which is a high-voltage power device, has advantages such as a fast switching speed and a high input impedance, low power consumption, compatibility with a CMOS process, and the like, and thereby is widely used for a variety of power devices including a display driving IC, a power converter, a motor controller, and an automotive power supply device. Here, the term "high voltage" typically means several tens of volts; however, it sometimes means several hundreds of volts.

However, as shown in FIG. 1, in the LDMOS device, a source and a drain are not symmetrically formed due to the characteristics of the LDMOS device, so that the LDMOS device can withstand a high drain-source voltage ($V_{DS}$), a low operation region voltage ($V_{GS}$) of gate-source can be created. Therefore, there is a problem in that it is not easy to control the gate when the LDMOS device is used as a floating switch.

FIG. 2 is a diagram that explains the problems that occur when switches (SW$_1$ and SW$_2$) are implemented inside an IC so as to adjust an input/output gain.

The circuit of FIG. 2 is a circuit for adjusting the input/output gain between an input voltage ($V_{IN}$) and an output voltage ($V_{OUT}$) through a reference voltage ($V_{REF}$) and impedances ($Z_1, Z_{21}, Z_{22}$), so that the LDMOS device, which is a high-voltage power device, is required to be used in the switches (SW$_1$ and SW$_2$) so as to deal with the high voltage when a power supply voltage ($V_{DD}$) is high inside the IC.

However, as an example, when $V_{DD}$=40V and $V_{SS}$=0V are satisfied, and voltages of A and terminals move in almost the same region, an LDMOS gate voltage of the switches (SW$_1$ and SW$_2$) is required to move together with the voltages of the A and B terminals; however, it is very difficult to control this due to the characteristics of the LDMOS.

SUMMARY OF THE INVENTION

Accordingly, the present invention has been made in an effort to solve the problems occurring in the related art, and an object of the present invention is to provide a switch circuit using an LDMOS (lateral diffusion metal oxide semiconductor) device, which may control the on/off operation of the switch circuit by adjusting the gate-source voltage ($V_{GS}$) of the LDMOS device through a current source and resistances.

In order to achieve the above object, according to one aspect of the present invention, there is provided a switch circuit which is turned on and turned off between a first terminal (A) and a second terminal (B), the switching circuit using an LDMOS device, including: a first current source ($I_1$), one end of which is connected with a power supply voltage ($V_{DD}$); a first resistance ($R_1$), one end of which is connected with the other end of the first current source; first and second N-type LDMOSs (MN$_1$ and MN$_2$), in which respective gates are connected with each other to be connected with the one end of the first resistance, respective sources are connected with each other to be connected with the other end of the first resistance, and respective drains are connected with the first and second terminal; and a second current source ($I_2$), one end of which is connected with the connected sources of the first and second N-type LDMOSs, and the other end of which is connected with a ground voltage ($V_{SS}$).

According to another aspect of the present invention, there is provided a switch circuit which is turned on and turned off between a first terminal (A) and a second terminal (B), the switching circuit using an LDMOS device, including: a first current source ($I_1$) one end of which is connected with a power supply voltage ($V_{DD}$); a first resistance ($R_1$), one end of which is connected with the other end of the first current source; first and second N-type LDMOSs ($MN_1$ and $MN_2$), in which respective gates are connected with each other to be connected with the one end of the first resistance, respective sources are connected with each other to be connected with the other end of the first resistance, and respective drains are connected with first and second terminal; first and second P-type LDMOSs ($MP_1$ and $MP_2$), in which respective drains are connected with the first and second terminals, respective gates are connected with each other, and respective sources are connected with each other; a second resistance ($R_2$), one end of which is connected with the connected sources of the first and second P-type LDMOSs; and a second current source ($I_2$), one end of which is connected in common with the other end of the second resistance and the connected gates of the first and second P-type LDMOSs, and the other end of which is connected with a ground voltage ($V_{SS}$).

Here, the first and second current sources may have the same current value, and the switch circuit may be turned on when each of the first and second current sources has a predetermined current value ($I_B$) or larger.

Preferably, the first and second current sources may be configured in a cascade type arrangement.

Also, it is preferable that at least one of the first and second resistances be a variable resistance, and that the first and second resistances have the same resistance value.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
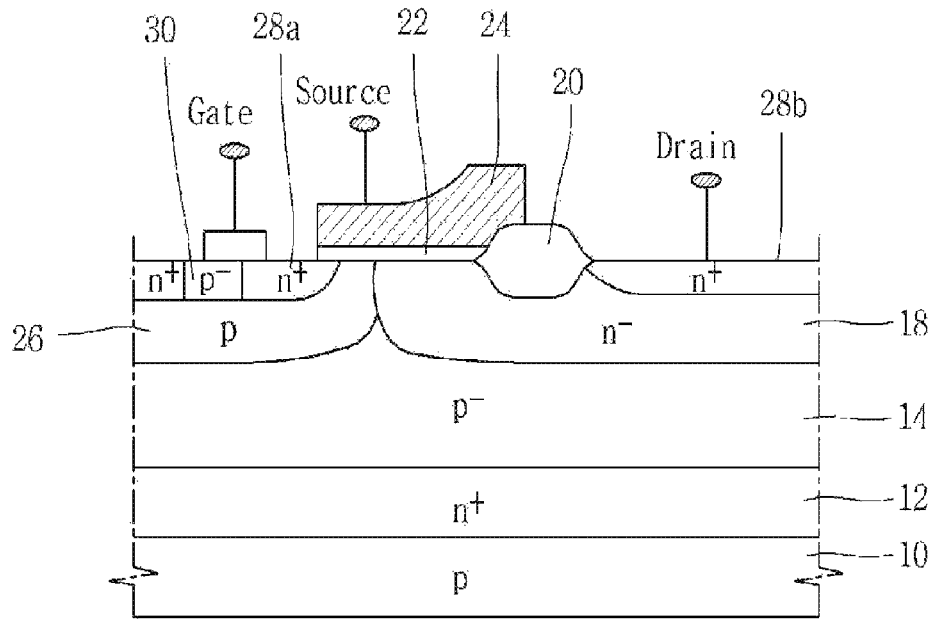
FIG. 1 is a cross-sectional diagram of a general LDMOS (lateral diffusion metal oxide semiconductor) device.
Figure 2:
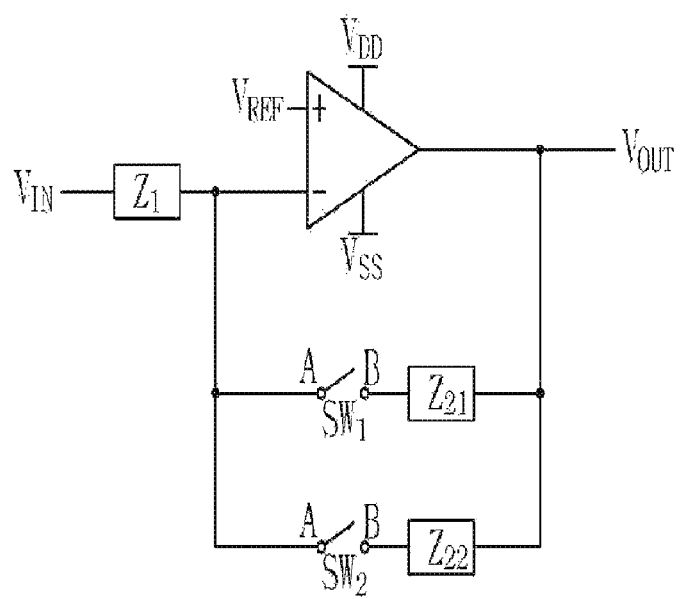
FIG. 2 is a diagram that explains the problem that occurs when switches ($SW_1$ and $SW_2$) are implemented inside an IC (Integrated Circuit) so as to adjust input/output gain.

Reference will now be made in greater detail to a preferred embodiment of the invention, an example of which is illustrated in the accompanying drawings. Wherever possible, the same reference numerals will be used throughout the drawings and the description to refer to the same or like parts.

Hereinafter, preferred embodiments of the present invention will be described in detail with reference to the accompanying drawings.

A switch circuit according to an embodiment of the present invention includes LDMOSs for switching connections of terminals and a control circuit for controlling gate-source voltages ($V_{GS}$) of the LDMOSs.

The LDMOSs may include N-type LDMOSs of which the sources are connected to each other or P-type LDMOSs of which the sources are connected to each other. Furthermore, the LDMOSs may include a complementary configuration of N-type LDMOSs of which the sources are connected to each other and P-type LDMOS devices of which the sources are connected to each other.

The control circuit includes a control current source configured to receive a first voltage through one end thereof and a control resistance connected between the control current source and the sources of the LDMOSs. The control resistance serves to form a gate-source voltage ($V_{GS}$) for each of the LDMOSs using a current of the control current source corresponding to the first voltage.

The control circuit may include an offset current source for offsetting an internal current generated by the control current source, and the offset current source may receive a second voltage and provide a current corresponding to the second voltage to the sources of the LDMOSs.

Figure 3:
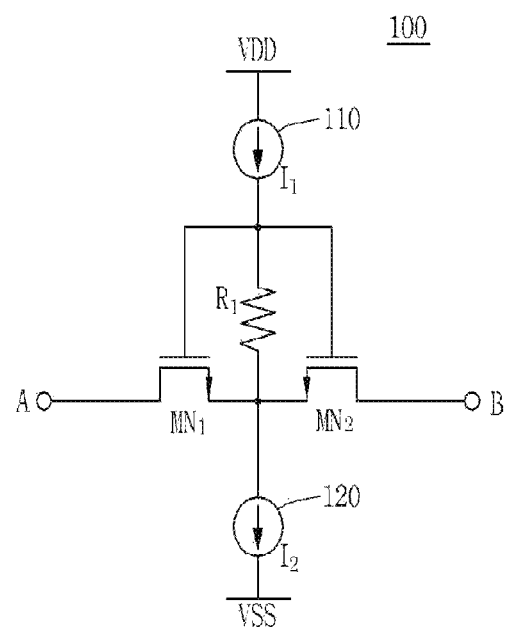
FIG. 3 is a diagram illustrating a switch circuit using an LDMOS device according to a first embodiment of the present invention.
Figure 4:
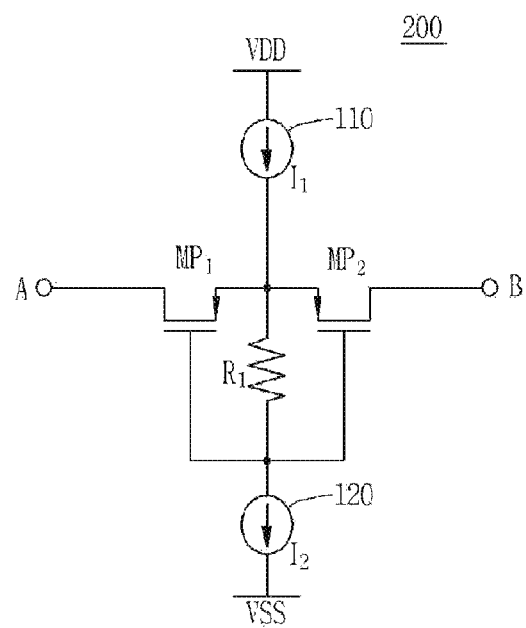
FIG. 4 is a diagram illustrating a switch circuit using an LDMOS device according to a second embodiment of the present invention.
Figure 5:
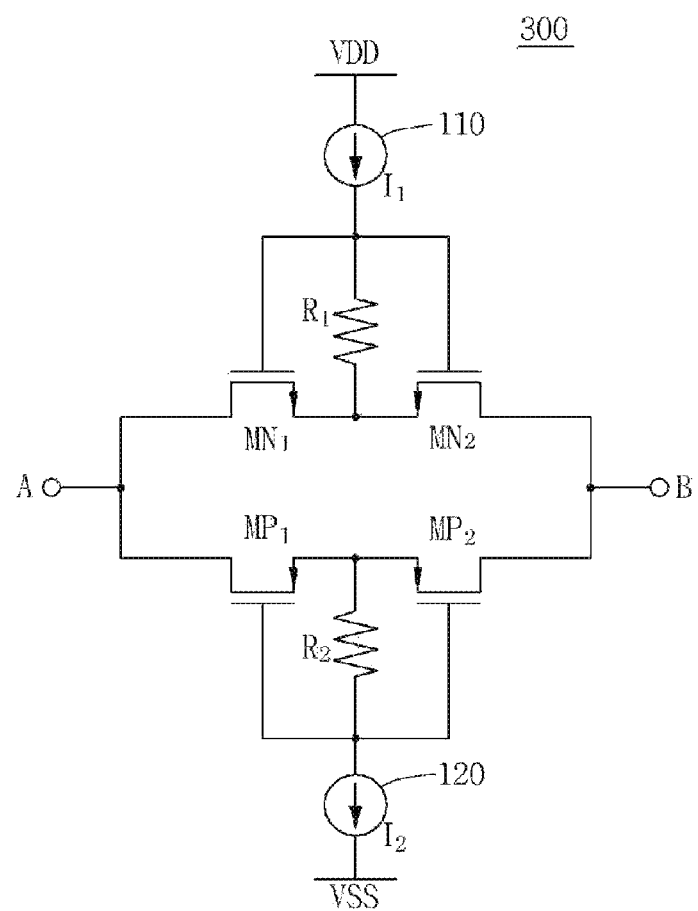
FIG. 5 is a diagram illustrating a switch circuit using an LDMOS device according to a third embodiment of the present invention.

The switch circuit according to the embodiment of the present invention may be configured as illustrated in first to third embodiments of FIGS. 3 to 5.

FIG. 3 is a diagram illustrating a switch circuit using an LDMOS (lateral diffusion metal oxide semiconductor) device according to a first embodiment of the present invention.

Referring to FIG. 3, a switch circuit 100 using an LDMOS device according to the first embodiment of the present invention is a switch circuit which is turned on and turned off between a first terminal (A) and a second terminal (B), and includes first and second current sources 110 and 120, a first resistance ($R_1$), and first and second N-type LDMOSs ($MN_1$ and $MN_2$). The first current source 110 corresponds to a control current source, the second current source 120 corresponds to an offset current source, the first resistance ($R_1$) corresponds to a control resistance, and the first and second N-type LDMOSs (MN' and $MN_2$) correspond to LDMOSs. A high voltage, for example, several tens of volts or several hundreds of volts, may be applied between the first terminal (A) and the second terminal (B).

One end of the first current source 110 is connected with a power supply voltage ($V_{DD}$), and one end of a first resistance ($R_1$) is connected with the other end of the first current source 110. Gates of the first and second N-type LDMOSs ($MN_1$ and $MN_2$) are connected with each other to be connected with the one end of the first resistance ($R_1$), sources thereof are connected with each other to be connected with the other end of the first resistance, and respective drains thereof are connected with the first and second terminals A and B, which are both terminals of the switch circuit. One end of the second current source 120 is connected to the connected sources of the first and second N-type LDMOSs, and the other end thereof is connected with a ground voltage ($V_{SS}$).

The first and second current sources 110 and 120 can be any type that is known by persons having average knowledge in the art, including a type in which a transistor is used as a current mirror, and preferably are configured in a cascade type arrangement so as to increase the output resistance thereof. In an embodiment of the present invention, the first current source 110 provides a source current ($I_1$), and the second current source 120 provides a sink current ($I_2$).

The first resistance ($R_1$) is preferably a variable resistance, the resistance value of which is appropriately changed as necessary; however, the invention is not limited thereto, and includes all types of resistances. In addition, the first and second N-type LDMOSs ($MN_1$ and $MN_2$) can be any type that is known by persons having average knowledge in the art. The first and second N-type LDMOSs ($MN_1$ and $MN_2$) may be equalized by an N-type MOS and a parasitic diode between a drain and a source. In the present invention, for the convenience of description, the parasitic diode is not illustrated; however, the equalization will be apparent to persons skilled in the art.

In the present embodiment, the on/off operation of the switch circuit 100 may be controlled through the first and second current sources 110 and 120. That is, when each of the source current ($I_1$) and the sink current ($I_2$) has a predetermined current value ($I_B$) or greater, the switch circuit 100 is turned on, and when each of the source current ($I_1$) and the sink current ($I_2$) has less than a predetermined current value ($I_B$), the switch circuit 100 is turned off.

Here, the predetermined current value ($I_B$) is a current value which can create the gate-source voltage ($V_{GS}$) for turning on the first and second N-type LDMOSs ($MN_1$ and $MN_2$). In addition, it is preferable that the source current ($I_1$) and the sink current ($I_2$) have the same value.

First, when each of the source current ($I_1$) and the sink current ($I_2$) has the predetermined current value ($I_B$) or greater, voltage from the source current ($I_1$) and the first resistance ($R_1$) is applied to a gate of the first and second N-type LDMOSs ($MN_1$ and $MN_2$), thereby increasing the gate voltage. The gate voltage may be determined by controlling the first current source 110 so that it corresponds to the voltage across the first terminal A and the second terminal B.

When a high voltage is applied to both ends of the switch circuit 100, the gate voltage of the first and second N-type LDMOSs ($MN_1$ and $MN_2$) is increased corresponding to the high voltage, so that the gate-source voltage ($V_{GS}$) for normally turning on the first and second N-type LDMOSs ($MN_1$ and $MN_2$) may be secured. In this case, the switch circuit 100 according to the present embodiment may be connected between the first terminal A and the second terminal B, to thereby be turned on.

The source current ($I_1$) is divided into the first terminal A and the second terminal B by half through the turned-on first and second N-type LDMOSs ($MN_1$ and $MN_2$) to thereby flow therein; however, the source current ($I_1$) is offset inside the switch circuit 100 by the second current source 12 without flowing to the outside of the switch circuit 100 when the sink current ($I_2$) from the second current source 120 is the same as the source current ($I_1$). The sink current ($I_2$) and the source current ($I_1$) may differ from each other. In this case, a current corresponding to a difference between the sink current ($I_2$) and the source current ($I_1$) may be dispersed to flow into the first and second terminals A and B.

Next, when each of the source current ($I_1$) and the sink current ($I_2$) has less than the predetermined current value ($I_B$), the first and second N-type LDMOSs ($MN_1$ and $MN_2$) are turned on, so that the switch circuit 100 according to the embodiment of the present invention may be turned off between the first terminal A and the second terminal B.

Here, it will be apparent from the above descriptions and from FIG. 3 that the gate-source voltage ($V_{GS}$) of the first and second N-type LDMOSs ($MN_1$ and $MN_2$) may be controlled by appropriately adjusting the value of the first resistance ($R_1$) as well as the first and second current sources 110 and 120, so that the switch circuit 100 according to the embodiment of the present invention may be turned on and turned off.

According to the first embodiment of FIG. 3, the second current source 120 corresponding to an offset current source may be modified. That is, according to a modification of the first embodiment, the second current source 120 may be configured to provide the sink current ($I_2$) as substantially zero or block the flow of the sink current ($I_2$).

Furthermore, according to the modification of the first embodiment, the second current source 120 may be excluded from the configuration of the first embodiment. That is, the switch circuit according to the modification of the first embodiment may include the first current source 110, the first resistance ($R_1$), and the first and second N-type LDMOSs ($MN_1$ and $MN_2$). In this case, the source current (10 may be dispersed to flow to the first and second terminals A and B through the first and second N-type LDMOSs ($MN_1$ and $MN_2$) which are turned on. FIG. 4 is a diagram illustrating a switch circuit using an LDMOS device according to a second embodiment of the present invention. Here, like reference numerals refer to the same elements as in the embodiment shown in FIG. 3.

Referring to FIG. 4, a switch circuit 200 using an LDMOS device according to an embodiment of the present invention is a switch circuit that is turned on and turned off between a first terminal A and a second terminal B, and includes first and second current sources 110 and 120, a first resistance ($R_1$), and first and second P-type LDMOSs ($MP_1$ and $MP_2$). The second current source 120 corresponds to a control current source, the first current source 110 corresponds to an offset current source, the first resistance $R_1$ corresponds to a control resistance, and the first and second P-type LDMOSs ($MP_1$ and $MP_2$) correspond to LDMOSs.

One end of the first current source 110 is connected with a power supply voltage ($V_{DD}$), each drain of the first and second P-type LDMOSs ($MP_1$ and $MP_2$) is connected with the first and second terminals (A and B), respectively, and respective sources thereof are connected with each other to thus be connected with the other end of the first current source 110. One end of the first resistance ($R_1$) is connected with the connected sources of the first and second P-type LDMOSs ($MP_1$ and $MP_2$). In addition, one end of the second current source 120 is connected in common with the other end of the first resistance ($R_1$) and the connected gates of the first and second P-type LDMOSs ($MP_1$ and $MP_2$), and the other end of the second current source 120 is connected with a ground voltage ($V_{SS}$).

In the embodiment of the present invention, the on/off operation of the switch circuit 200 may be controlled through the first and second current sources 110 and 120. That is, when each of the source current and the sink current has a predetermined current value ($I_B$) or greater, the switch circuit 200 may be turned on, and when each of the source current and the sink current has less than the predetermined current value ($I_B$), the switch circuit 200 may be turned off. Here, the predetermined current value ($I_B$) is a current value that can create a gate-source voltage ($V_{GS}$) for turning on the first and second P-type LDMOSs ($MP_1$ and $MP_2$). In addition, it is preferable that the source current ($I_1$) and the sink current ($I_2$) have the same value.

First, when each of the source current ($I_1$) and the sink current ($I_2$) has the predetermined current value ($I_B$) or greater, the voltage form the sink current ($I_2$) and the first resistance ($R_1$) may the gate-source voltage ($V_{GS}$) that can turn on the first and second P-type LDMOSs ($MP_1$ and $MP_2$). In this case, the switch circuit of the present invention is turned on between the first terminal A and the second terminal B.

In this instance, the source current ($I_1$) is divided into the first and second terminals A and B by half through the turned-on first and second P-type LDMOSs ($MP_1$ and $MP_2$) to thereby flow; however, the source current ($I_1$) is offset inside the switch circuit 200 without flowing outside the switch circuit 200 when the sink current ($I_2$) from the second current source 120 is the same as the source current ($I_1$). The sink current ($I_2$) and the source current ($I_1$) may differ from each other. In this case, a current corresponding to a difference between the sink current ($I_2$) and the source current ($I_1$) may be dispersed to flow into the first and second terminals A and B.

Here, it will be apparent from the above descriptions and FIG. 4 that the gate-source voltage ($V_{GS}$) of the first and second P-type LDMOSs ($MP_1$ and $MP_2$) may be controlled by appropriately adjusting the value of the first resistance ($R_1$) as well as the first and second current sources 110 and 120, thereby turning on and off the switch circuit according to the embodiment of the present invention.

According to the second embodiment of FIG. 4, the first current source 110 corresponding to an offset current source may be modified. That is, according to a modification of the second embodiment, the first current source 110 may be configured to provide the source current ($I_1$) as substantially zero or block the flow of the source current ($I_1$).

Furthermore, according to the modification of the second embodiment, the first current source 110 may be excluded from the configuration of the second embodiment. That is, the switch circuit according to the modification of the second embodiment may include the second current source 120, the first resistance ($R_1$), and the first and second P-type LDMOSs ($MP_1$ and $MP_2$). In this case, the sink current ($I_2$) may be dispersed to flow to the first and second terminals A and B through the first and second P-type LDMOSs ($MP_1$ and $MP_2$) which are turned on.

FIG. 5 is a diagram illustrating a switch circuit using an LDMOS device according to a third embodiment of the present invention. Here, like reference numerals refer to the same elements as in the embodiment shown in FIG. 3.

Referring to FIG. 5, a switch circuit 300 using an LDMOS device according to the third embodiment of the present invention is a switch circuit that is turned on and turned off between a first terminal A and a second terminal B, and includes first and second current sources 110 and 120, first and second resistances ($R_1$ and $R_2$), first and second N-type LDMOSs ($MN_1$ and $MN_2$), and first and second P-type LDMOSs ($MP_1$ and $MP_2$).

One end of the first current source 110 is connected with a power supply voltage ($V_{DD}$), and one end of the first resistance ($R_1$) is connected with the other end of the first current source 110. In the first and second N-type LDMOSs ($MN_1$ and $MN_2$), respective gates are connected with each other to thus be connected with the one end of the first resistance ($R_1$), respective sources are connected with each other to thus be connected with the other end of the first resistance, and respective drains are connected with the first and second terminals (A and B), which are respective ends of the switch circuit.

In the first and second P-type LDMOSs ($MP_1$ and $MP_2$), each drain is connected with the first and second terminals (A and B), respectively, and a gate and a source are connected with each other. One end of the second resistance ($R_2$) is connected with the connected sources of the first and second P-type LDMOSs ($MP_1$ and $MP_2$). In addition, one end of the second current source 120 is connected in common with the other end of the second resistance ($R_2$) and the connected gates of the first and second P-type LDMOSs ($MP_1$ and $MP_2$), and the other end of the second current source 120 is connected to a ground voltage ($V_{SS}$).

Here, it is preferable that at least one of the first resistance (R1) and the second resistance (R2) be a variable resistance, the resistance value of which is appropriately changed as necessary; however, the invention is not limited thereto, and includes all types of resistances. In addition, the first and second N-type LDMOSs ($MN_1$ and $MN_2$) and the first and second P-type LDMOSs ($MP_1$ and $MP_2$) can be any type that is known by persons having average knowledge in the art. The first and second N-type LDMOSs ($MN_1$ and $MN_2$) may be equalized by an N-type MOS and a parasitic diode between the drain and the source. In the present invention, for the convenience of description, the parasitic diode is not illustrated; however, equalization will be apparent to persons skilled in the art.

In the embodiment shown in FIG. 5, like the embodiments shown in FIGS. 3 and 4, the switch circuit may be turned on and turned off through the first and second current sources 110 and 120. That is, when each of the source current ($I_1$) and the sink current ($I_2$) from the first and second current sources 110 and 120 has a predetermined current value ($I_B$) or greater, the switch circuit 300 is turned off. Here, the predetermined current value ($I_B$) is a current value that can create the gate-source voltage ($V_{GS}$) for turning on the first and second P-type LDMOSs ($MP_1$ and $MP_2$). In addition, it is preferable that the source current ($I_1$) and the sink current ($I_2$) have the same value.

First, when each of the source current ($I_1$) and the sink current ($I_2$) form the first and second current sources 110 and 120 has the predetermined current value ($I_B$) or greater, the voltage from the source current ($I_1$) and the first resistance ($R_1$) becomes the gate-source voltage ($V_{GS}$), which can turn on the first and second N-type LDMOSs ($MN_1$ and $MN_2$), and the voltage from the sink current ($I_2$) and the second resistance ($R_2$) becomes the gate-source voltage ($V_{GS}$), which can turn on the first and second P-type LDMOSs ($MP_1$ and $MP_2$). In this case, the switch circuit according to the embodiment of the present invention is turned on between the first terminal (A) and the second terminal (B).

In this instance, the source current ($I_1$) is divided into the first and second terminals (A and B) by half through the turned-on first and second N-type LDMOSs ($MN_1$ and $MN_2$) to thereby flow; however, the source current (I1) is returned to its original state through the turned-on first and second P-type LDMOSs ($MP_1$ and $MP_2$) without flowing to the outside of the switch circuit when the sink current ($I_2$) is the same as the source current ($I_1$), and is then offset inside the switch circuit by the second current source.

Next, when each of the source current ($I_1$) and the sink current ($I_2$) from the first and second current sources 110 and 120 has less than the predetermined current value ($I_B$), each of the LDMOSs ($MN_1$, $MN_2$, $MP_1$ and $MP_2$) is turned off, and the switch circuit 300 according to the embodiment of the present invention is turned off between the first terminal (A) and the second terminal (B).

Here, it will be apparent from the above descriptions and from FIG. 5 that the gate-source voltage ($V_{GS}$) of each of the LDMOSs ($MN_1$, $MN_2$, $MP_1$ and $MP_2$) may be controlled by appropriately adjusting the first and second resistance ($R_1$ and $R_2$) values as well as the first and second current sources 110 and 120, thereby turning on and turning off the switch circuit 300 according to the embodiment of the present invention.

As described above, the switch circuit 300 according to the embodiment of the present invention shown in FIG. 5, unlike the switch circuits 100 and 200 shown in FIGS. 3 and 4, uses the N-type LDMOS and the P-type LDMOS in a complementary manner. Thus, the characteristics of the switch may be maintained regardless of the voltages of both terminals (A and B), and the current generated by the current source may be offset inside the switch without flowing to the outside of the switch.

In addition, the switch circuit using the LDMOS device according to the present embodiment may be implemented in such a manner as to be disposed between the terminals to which a high voltage, for example, several tens of volts or several hundreds of volts, is applied inside the power IC.

As described above, the switch circuit using the LDMOS device according to an embodiment of the present invention has an advantage in that the gate-source voltage ($V_{GS}$) of the LDMOS device may be stably controlled through the current source and the resistance.

Furthermore, the switch circuit using the LDMOS device according to the embodiment of the present invention may complementarily use N-type LDMOSs and P-type LDMOSs such that the characteristics thereof are maintained regardless of the voltages of both terminals A and B.

Furthermore, the current supplied to control the gate-source voltages ($V_{GS}$) of the LDMOSs which are complementarily used may be disposed into the terminals of the switch circuit or offset inside the switch circuit.

Although a preferred embodiment of the present invention has been described for illustrative purposes, those skilled in the art will appreciate that various modifications, additions and substitutions are possible, without departing from the scope and the spirit of the invention as disclosed in the accompanying

What is claimed is:

1. A switch circuit which switches connections of a first terminal and a second terminal, comprising:
    a first lateral diffusion metal oxide semiconductor (LDMOS) device and a second LDMOS device of which sources are connected between the first terminal and the second terminal;
    a control resistance configured to form a gate-source voltage for the first LDMOS device and the second LDMOS device; and
    a control circuit configured to control the gate-source voltage in response to a first voltage.

2. The switch circuit according to claim 1, wherein the first LDMOS device and the second LDMOS device comprise a first N-type LDMOS device and a second N-type LDMOS device.

3. The switch circuit according to claim 2, wherein the control circuit comprises:
    a control current source configured to provide a source current corresponding to the first voltage, wherein the gate-source voltage is formed in response to the source current of the control current source.

4. The switch circuit according to claim 3, wherein the control current source uses a power supply voltage as the first voltage.

5. The switch circuit according to claim 3, wherein the control current source is configured to provide the source current to the control resistance and respective gates of the first N-type LDMOS device and the second N-type LDMOS device.

6. The switch circuit according to claim 3, wherein the control circuit further comprises an offset current source configured to provide a sink current corresponding to a second voltage to the sources of the first N-type LDMOS device and the second N-type LDMOS device.

7. The switch circuit according to claim 6, wherein the offset current source uses a ground voltage as the second voltage.

8. The switch circuit according to claim 6, wherein the source current and the sink current are provided at a same level.

9. The switch circuit according to claim 6, wherein the source current and the sink current are provided at different levels.

10. The switch circuit according to claim 6, wherein the offset current source is configured to provide the sink current as substantially zero or block a flow of the sink current.

11. The switch circuit according to claim 1, wherein the first LDMOS device and the second LDMOS device comprise a first P-type LDMOS device and a second P-type LDMOS device.

12. The switch circuit according to claim 11, wherein the control circuit comprises:
    a control current source configured to provide a sink current corresponding to the first voltage; wherein the gate-source voltage is formed in response to the sink current of the control current source.

13. The switch circuit according to claim 12, wherein the control current source uses a ground voltage as the first voltage.

14. The switch circuit according to claim 12, wherein the control current source is configured to provide the sink current to the control resistance and respective gates of the first P-type LDMOS device and the second P-type LDMOS device.

15. The switch circuit according to claim 12, wherein the control circuit further comprises an offset current source configured to provide a source current corresponding to a second voltage to the sources of the first P-type LDMOS device and the second P-type LDMOS device.

16. The switch circuit according to claim 15, wherein the offset current source uses a power supply voltage as the second voltage.

17. The switch circuit according to claim 15, wherein the source current and the sink current are provided at a same level.

18. The switch circuit according to claim 15, wherein the source current and the sink current are provided at different levels.

19. The switch circuit according to claim 15, wherein the offset current source is configured to provide the source current as substantially zero or block a flow of the source current.

20. The switch circuit according to claim 1, wherein respective gates of the first LDMOS device and the second LDMOS device are connected with each other to be connected with one end of the control resistance and respective sources of the first LDMOS device and the second LDMOS device are connected with each other to be connected with the other end of the control resistance.

* * * * *